United States Patent [19]

Okanoue et al.

[11] Patent Number: 5,444,721
[45] Date of Patent: Aug. 22, 1995

[54] MAXIMUM LIKELIHOOD SEQUENCE ESTIMATION APPARATUS

[75] Inventors: Kazuhiro Okanoue; Akihisa Ushirokawa; Yukitsuna Furuya, all of Tokyo, Japan

[73] Assignee: NEC Corporation, Tokyo, Japan

[21] Appl. No.: 981,309

[22] Filed: Nov. 25, 1992

[30] Foreign Application Priority Data

Nov. 27, 1991 [JP] Japan .................. 3-312244

[51] Int. Cl.$^6$ .................................. H04L 5/22
[52] U.S. Cl. .................... 371/43; 375/341
[58] Field of Search ............ 371/43, 6, 37.8, 44, 371/46, 56, 30, 56; 375/94, 99, 101, 102, 80, 25, 27, 89; 364/715.06, 715.09, 715.12; 341/50

[56] References Cited

U.S. PATENT DOCUMENTS

| | | | |
|---|---|---|---|
| 4,422,165 | 12/1983 | Thomas et al. | 364/421 |
| 4,504,872 | 3/1985 | Petersen | 371/30 |
| 4,885,757 | 12/1989 | Provence | 371/43 |
| 5,065,411 | 11/1991 | Muto | 375/100 |
| 5,081,651 | 1/1992 | Kubo | 371/43 |
| 5,263,026 | 11/1993 | Parr et al. | 370/95.1 |
| 5,272,726 | 12/1993 | Furuya et al. | 371/43 |
| 5,272,727 | 12/1993 | Okanoue | 371/43 |
| 5,311,523 | 5/1994 | Serizawa et al. | 371/43 |
| 5,313,495 | 5/1994 | Kim | 375/94 |
| 5,325,402 | 6/1994 | Ushirokawa | 375/94 |

OTHER PUBLICATIONS

J. F. Hayes, "The Viterbi Algorithm Applied to Digital Data Transmission", IEEE, Communication Society, No. 13, pp. 15–20.

J. G. Proakis, "Digital Communications", McGraw-Hill, 1983.

Suzuki and Tajima, "Implementation of Maximum Likelihood Decoder for Convolutional Codes", Electronic Information Communication Institute Report A, vol. J73-A, No. 2, Feb. 1990, pp. 225–231.

C. N. Georghiades et al., "Sequence Estimation and Synchronization from Nonsynchronized Samples", IEEE Transactions on Information Theory, vol. 37, No. 6, Nov. 1, 1991, pp. 1649–1657.

G. M. Vachula et al., "On Optimal Detection of Band-Limited PAM Signals with Excess Bandwidth", IEEE Transactions on Communications, vol. COM-29, No. 6, Jun. 1981, pp. 886–890.

Primary Examiner—Robert W. Beausoliel, Jr.
Assistant Examiner—Dieu-Minh Le
Attorney, Agent, or Firm—Sughrue, Mion, Zinn, Macpeak & Seas

[57] ABSTRACT

A maximum likelihood sequence estimation apparatus decodes a digital data signal. The apparatus includes: a sampling device to perform sampling and to output a received signal by sampling pulses having a constant time interval T and N different sampling phases; an operation device to operate a branch metric of the received signal sampled by the N different sampling phases; and a device to perform maximum likelihood sequence estimation of the branch metric.

4 Claims, 8 Drawing Sheets

MAXIMUM LIKELIHOOD SEQUENCE ESTIMATION APPARATUS

BACKGROUND OF THE INVENTION

The present invention relates to a maximum likelihood sequence estimation apparatus which improves data transmission characteristic by eliminating distortion due to sampling timing error or inter symbol interferences (ISI) in case of transmitting data through time varying transmission paths causing inter symbol interferences.

Since it is difficult to obtain an optimum sampling timing from a receiving signal distorted by inter symbol interferences, a system is proposed to equalize and decode the signal using the signal sampled at a sampling frequency equal to an integer number of times of the symbol rate. One example of such system is to equalize and decode using a decision feedback equalizer of fractional interval. (See, for example, "Decision Feedback Equalization for Digital Cellular Radio" by S. Chennakeshu, et al., IEEE, Conf. Record on ICC '91, 339.4.1-339.4.5.)

A maximum likelihood sequence estimation apparatus is known to be an optimum system to eliminate distortion due to inter symbol interferences. (See, for example, "Digital Communications" by J. G. Proakis, McGraw-Hill, 1983.)

However, the conventional maximum likelihood sequence estimation system is incapable of correcting distortion due to sampling timing error because only known sampling frequency is equal to the symbol rate.

SUMMARY OF THE INVENTION

It is, therefore, an object of the present invention to provide a maximum likelihood sequence estimation apparatus capable of eliminating distortion due to sampling timing error from the optimum sampling timing and also distortion caused by inter symbol interferences.

For this end, the maximum likelihood sequence estimation apparatus according to the present invention is to decode a digital data signal and comprises sampling means to perform sampling and output a received signal by sampling pulses having a constant time interval T and N different sampling phases, operation means to operate branch metric of the received signal sampled by the N different sampling phases, and means to perform the maximum likelihood sequence estimation of the branch metric.

The maximum likelihood sequence estimation apparatus according to the present invention will be understood from the following description by reference to the accompanying drawings illustrating preferred embodiments of the present invention.

DESCRIPTION OF THE PREFERRED EMBODIMENTS

Figure 1:
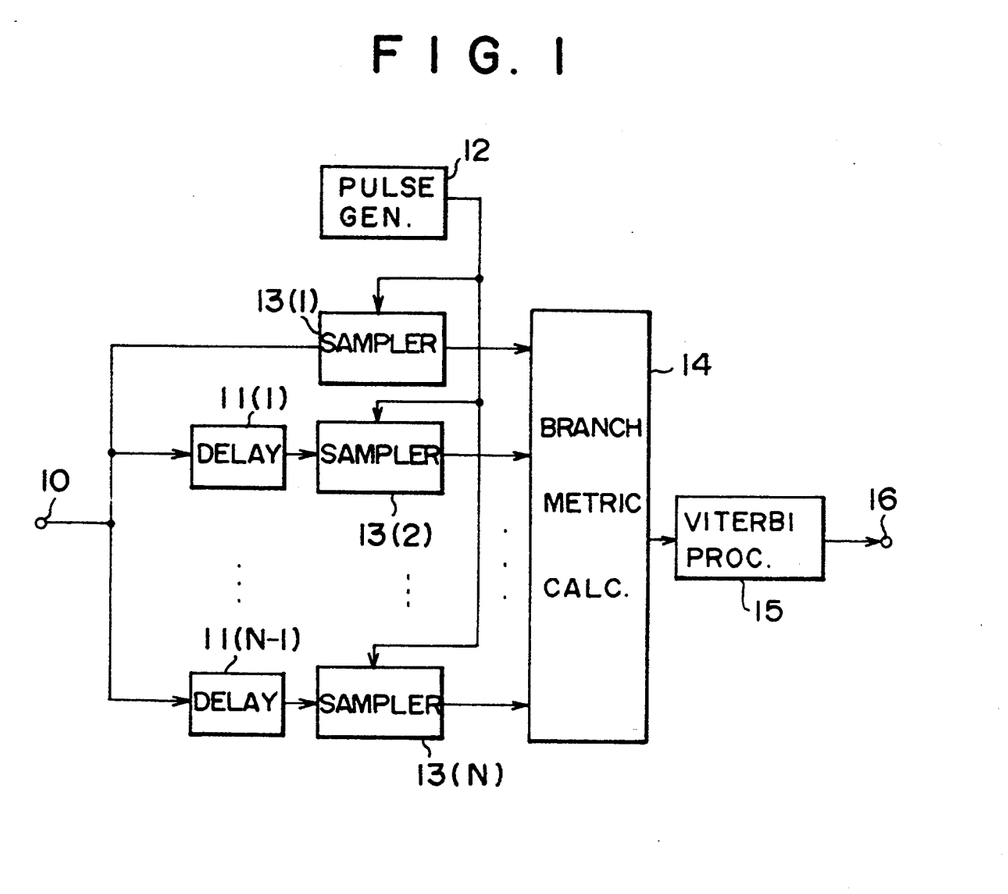
FIG. 1 is a block diagram of one embodiment of the first invention of the maximum likelihood sequence estimation apparatus.

Referring to FIG. 1, represented by reference numerals $10$, $11(1)$ through $11(N-1)$, $12$, $13(1)$ through $13(N)$, $14$, $15$ and $16$ are an input terminal, delay circuits to provide different delay times, a pulse generator circuit, samplers, a branch metric calculation circuit, a Viterbi processor and an output terminal, respectively.

A received input signal through the input terminal 10 is delayed by a bank of delay circuits $11(1)$ through $11(N-1)$ before reaching respective samplers $13(2)$ through $13(N)$. Also, the received signal is directly applied to the sampler $13(1)$ with no delay. The samplers $13(1)$ through $13(N)$ perform signal sampling of the received signal, and the outputs from the delay circuits $11(1)$ through $11(N)$ at the timing of the pulse generated from the pulse generator 12. When the sampling pulse frequency is $1/T$, the delay times of the delay circuits $11(1)$ through $11(N-1)$ are set to $iT/N$ ($i=1, 2, \ldots, N-1$), thereby sampling the received signal in sequentially different sampling phases by the samplers $13(1)$ through $13(N)$.

Figure 10:
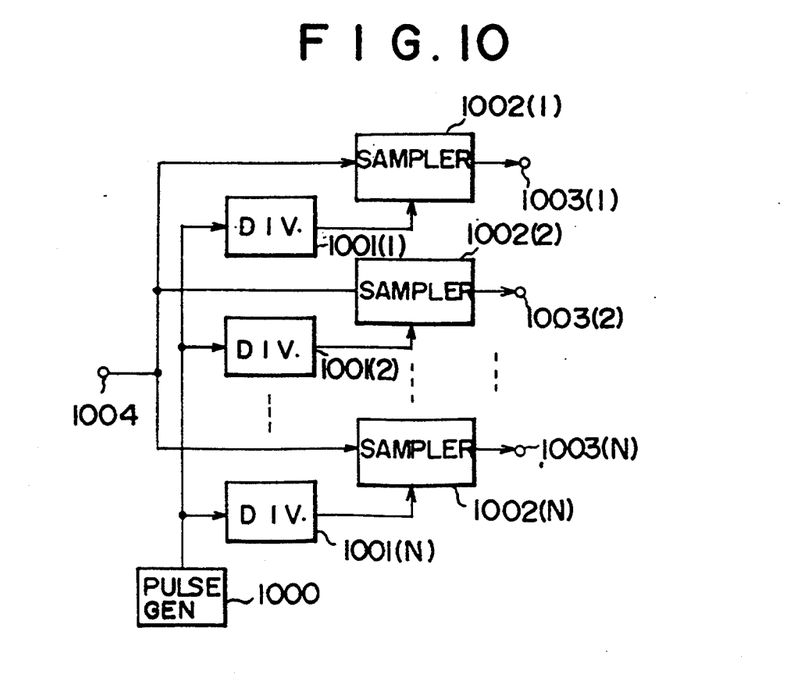
FIG. 10 is a block diagram of one example of the sampling and output means for sampling the received signal by sampling in N different sampling phases using sampling pulses having a constant time interval T and N (N>1) different phases.

An alternative sampling means of sampling the received signal in different sampling phases is illustrated in FIG. 10. Shown in FIG. 10 is a block diagram of one example of the sampling means to perform sampling the received signal in N different sampling phases using sampling pulses of N (N>1) different phases but each having a constant time interval T. In FIG. 10, a reference numeral 1004 is an input terminal, 1000 is a pulse generator to generate a sampling pulse having frequency equal to $1/NT$, $1001(1)$ through $1001(N)$ are frequency dividers to divide at different phases, $1002(1)$ through $1002(N)$ are samplers and $1003(1)$ through $1003(N)$ are output terminals.

In FIG. 10, the output from the pulse generator 1000 which generates the sampling pulse having the frequency equal to $1/NT$ is frequency divided at different phase angles by the frequency dividers $1001(1)$ through $1001(N)$ to supply the desired sampling pulses to the samplers $1003(1)$ through $1003(N)$.

It is also possible to generate the sampling pulse having the frequency equal to $1/LT$ (L<N) to generate the signal sampled in N different phases by means of interpolation and the like of the received signal sequence sampled in L different phases.

Figure 5:
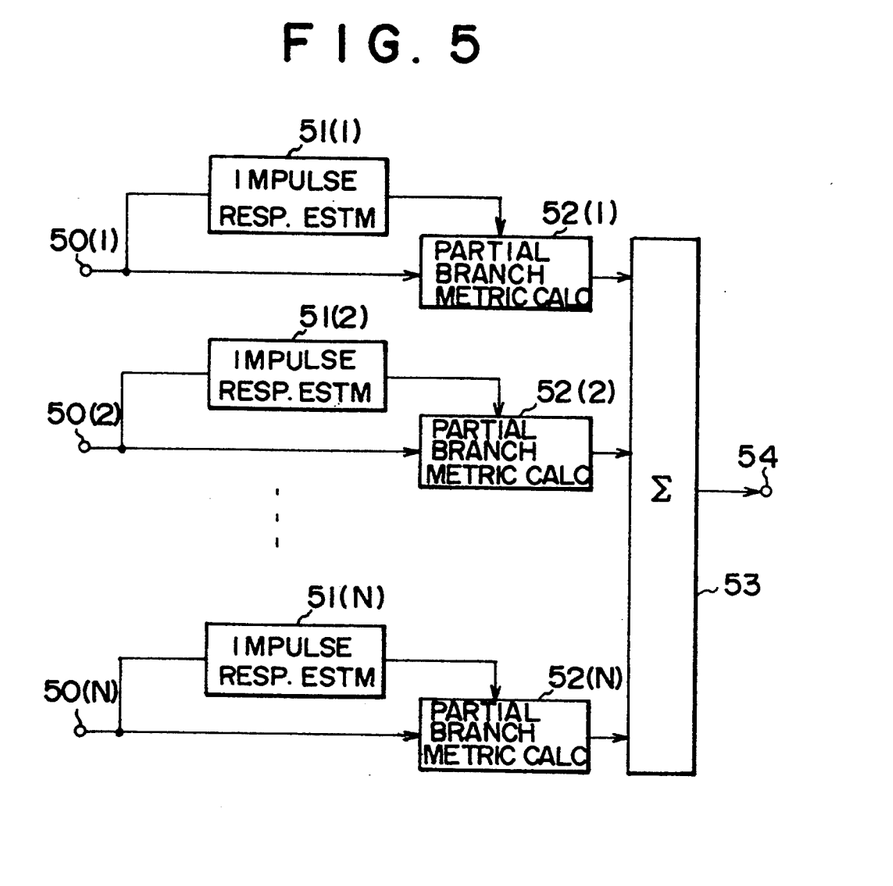
FIG. 5 is an example of the branch metric calculation circuit.

The signals sampled by the samplers $13(1)$ through $13(N)$ are supplied to the branch metric calculation circuit 14 to obtain the branch metric. The branch metric circuit 14 may be constructed, for example, as shown in FIG. 5. The outputs from the samplers 13(1) through 13(N) are supplied to the input terminals 50(1) through 50(N). The outputs to the input terminals 50(1) through 50(N) are applied to both of the channel impulse response estimation circuits 51(1) through 51(N) and the partial branch metric calculation circuits 52(1) through 52(N).

Each of the channel impulse response estimation circuits 51(1) through 51(N) may comprise a circuit to obtain correlation between the received signal and the preamble sequence as illustrated, for example, in FIG. 3 of European patent laid-open number A2-0396101 (laid open on Nov. 7, 1990) when using the preamble sequence exhibiting an impulse form of self-correlation function as shown in FIG. 2, for example, in the above European patent application. The channel impulse response estimation circuits 51(1) through 51(N) output channel impulse response vectors H(1) through H(N) of different sampling phases from the signals sampled in different phases. Each of the partial branch metric calculation circuits 52(1) through 52(N) receive as inputs the channel impulse response vectors H(1) through H(N) of different phases and the signal sampled in the phase corresponding to the sampling phase of the channel impulse response vector to calculate the partial branch metric. The partial branch metric will be obtained in the manner as given, for example, in the right member of the equation in J. F. Hayes, "The Viterbi Algorithm Applied to Digital Data Transmission" IEEE, Communication Society, No. 13, p 18, 8$b$, 1975. The output from the partial branch metric calculation circuits 52(1) through 52(N) are added to one another in an adder 53 to output the branch metric from the output terminal 54.

The calculated branch metric is applied to the Viterbi processor 15 to derive the decision result from the output terminal 16. The Viterbi processor 15 may be realized by a normal soft decision Viterbi decoder comprising an ACS (Add-Compare-Select) circuit and a path memory (See, for example, Suzuki and Tajima, "Implementation of Maximum Likelihood Decoder for Convolutional Codes" Electronic Information Communication Institute Report A, Vol. J73-A, No. 2, pp 225–231, February 1990).

This system can be easily applied to the diversity reception system having a plurality of branches. That is, each diversity branch is provided with a bank of delay circuits 11(1) through 11(N−1), a pulse generator (12), samplers 13(1) through 13(N) and a branch metric calculation circuit 14. The output from the branch metric calculation circuit in each diversity branch is composed by, for example, summation, thereby applying the composed value to the Viterbl processor as the branch metric of the entire diversity.

Figure 2:
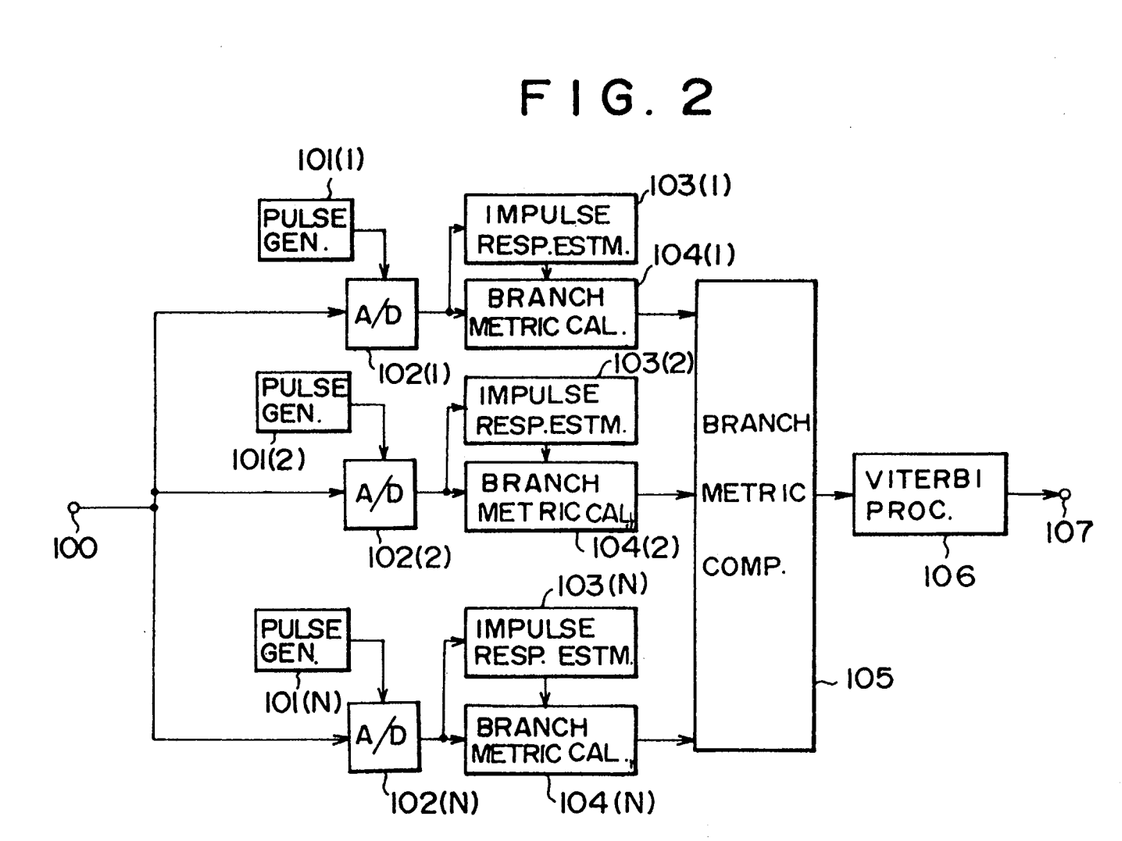
FIG. 2 is a block diagram of one embodiment of the second invention of the maximum likelihood sequence estimation apparatus.

Illustrated in FIG. 2 is a block diagram of one embodiment of the maximum likelihood sequence estimation apparatus according to a second invention. In FIG. 2, represented by a reference numeral 100 is an input terminal, 101(1) through 101(N) are pulse generators for generating sampling pulses at the frequency (1/T) equal to the symbol rate but in different phases, 102(1) through 102(N) are A-D (analog-to-digital) converters, 103(1) through 103(N) are channel impulse response estimation circuits, 104(1) through 104(N) are branch metric calculator circuits, 105 is a branch metric composite circuit, 106 is a Viterbi processor, and 107 is an output terminal.

The input signal received at the input terminal 100 is sampled and digitized by the A-D converters 102(1) through 102(N) at the timing of the respective pulses of different phases generated from the pulse generators 101(1) through 101(N). The outputs from the A-D converters 102(1) through 102(N) are applied to the channel impulse response estimation circuits 103(1) through 103(N) and the branch metric calculation circuits 104(1) through 104(N) o Each of the channel impulse response estimation circuits 103(1) through 103(N) may comprise a circuit to obtain correlation between the received signal and the preamble sequence as illustrated, for example, in FIG. 3 of European patent laid-open number A2-0396101 (laid open on Nov. 7, 1990) when using the preamble sequence exhibiting an impulse form of self-correlation function as shown in Fig. 2, for example, in the above European patent application. The channel impulse response estimation circuits 103(1) through 103(N) output channel impulse response vectors H(1) through H(N) of different sampling phases from the signals sampled in different phases. Each of the partial branch metric calculation circuits 104(1) through 104(N) receive as inputs the channel impulse response vectors H(1) through H(N) of different phases and the signal sampled in the phase corresponding to the sampling phase of the channel impulse response vector to calculate the partial branch metric. The partial branch metric will be obtained in the manner as given, for example, in the right member of the equation in J. F. Hayes, "The Viterbi Algorithm Applied to Digital Data Transmission" IEEE, Communication Society, No. 13, p 18, 8$b$, 1975.

Figure 6:
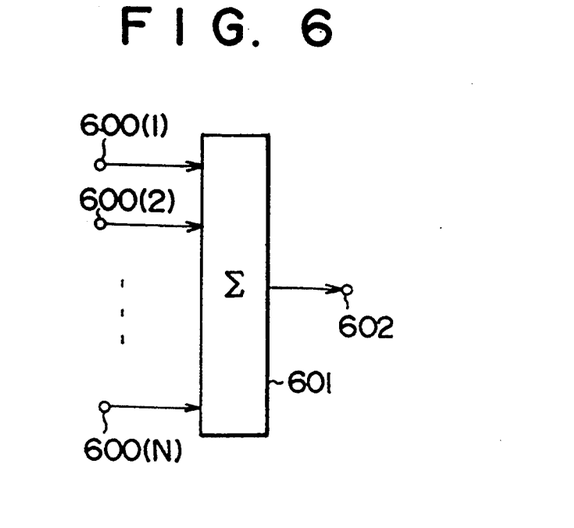
FIG. 6 is an example of the branch metric composite circuit.

The branch metric composite circuit 105 composites the branch metrics corresponding to the received signals of different sampling phases obtained from the branch metric calculation circuits 104(1) through 104(N), thereby outputting the composite branch metric. The branch metric composite circuit 105 may be configured, for example, as shown in FIG. 6. In FIG. 6, applied to the input terminals 600(1) through 600(N) are the branch metrics corresponding to the received signals of different sampling phases derived from the branch metric calculation circuits 104(1) through 104(N). The added output is derived from the output terminal 602 as the composite branch metric. The composite branch metric thus derived is applied to the Viterbi processor 106 and the decision result is derived from the output terminal 107.

The Viterbi processor 15 may be realized by a normal soft decision Viterbi decoder comprising an ACS (Add-Compare-Select) circuit and a path memory (See, for example, Suzuki and Tajima, "Implementation of Maximum Likelihood Decoder for Convolutional Codes" Electronic Information Communication Institute Report A, Vol. J73-A, No. 2, pp 225–231, February 1990).

Figure 3:
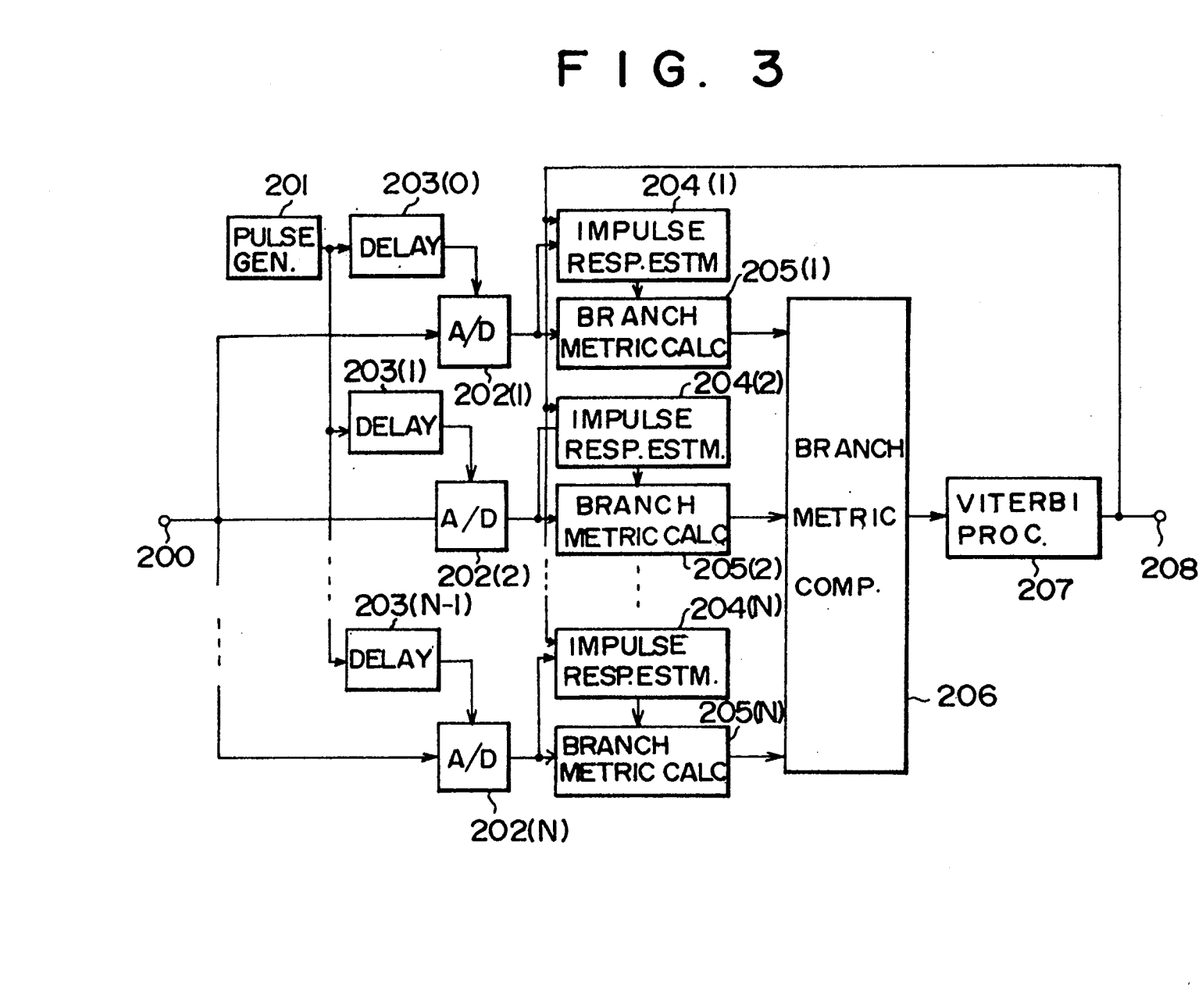
FIG. 3 is a block diagram of one embodiment of the third invention of the maximum likelihood sequence estimation apparatus.

Shown in FIG. 3 is a block diagram of one embodiment of the maximum likelihood sequence estimation apparatus according to a third invention. In FIG. 3, represented by a reference numeral 200 is an input terminal, 201 is a pulse generator circuit to generate a sampling pulse at frequency (1/T) equal to the symbol rate, 202(1) through 202(N) are A—D converters, 203(0) through 203(N−1) are delay circuits to provide respectively delay time iT/N (i=1, 2, ..., N−1), 204(1) through 204(N) are channel impulse response estimation circuits, 205(1) through 205(N) are branch metric calculation circuits, 206 is a branch metric composite circuit, 207 is a Viterbi processor, and 208 is an output terminal.

The sampling pulse generated by the pulse generator circuit 201 is directly applied to the A-D converter 202(1) and also applied to the A-D converters 202(2) through 202(N) by way of the delay circuits 203(0) through 203(N−1). Sampling of the received signal supplied from the input terminal 200 is performed in the A-D converters 202(1) through 202(N) whenever the sampling pulse is applied thereto for digitizing the received signal. The outputs from the A-D converters 202(1) through 202(N) are supplied to the respective channel impulse response estimation circuits 204(1) through 204(N) and branch metric calculation circuits 205(1) through 205(N). Each of the channel impulse response estimation circuits 204(1) through 204(N) receives as inputs the decision result from the Viterbi processor 207 and the output from the respective A-D converters 202(1) through 202(N) for outputting the M dimensional channel impulse response estimation vectors H(1) through H(N) corresponding to the respective output from the A-D converter circuits 202(1) through 202(N). Each of the channel impulse response estimation circuits 204(1) through 204(N) may be implemented, for example, as shown in FIG. 7.

Figure 7:
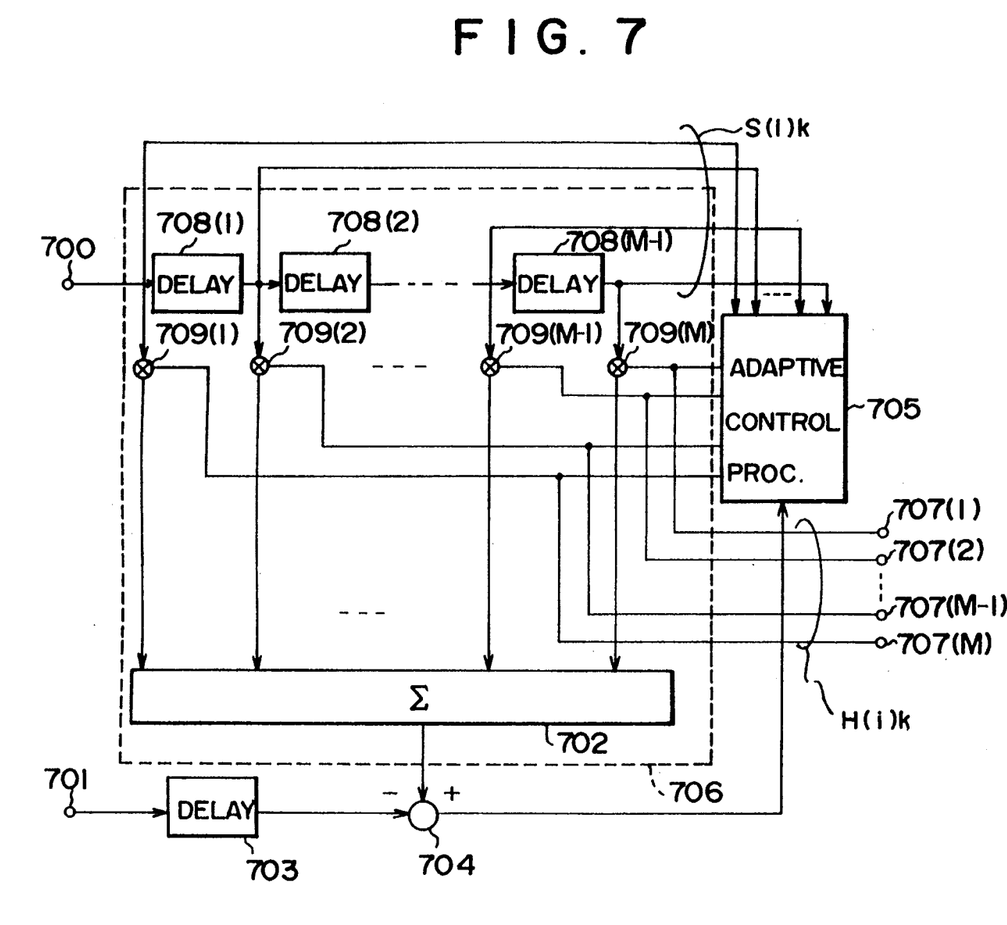
FIG. 7 is a block diagram of one example of a channel impulse response estimation circuit.

In FIG. 7, applied to the input terminal 700 is the decision result from the Viterbi processor 207 while applied to the input terminal 701 is the output from the respective A-D converters 202(1) through 202(N). A replica of the received signal is obtained by convolution of the decision result and the M dimensional channel impulse response estimation vectors H(i), i=1, 2, ..., N using an M-tapped transversal filter 706. It is to be noted here that any timing error between the replica of the received signal and the actual received signal due to decoding delay time is compensated by delaying the actual received signal from the input terminal 700 using a delay circuit 703 (See, for example, Proakis, "Digital Communications", McGraw-Hill, 1983.) A subtraction circuit 704 detects an error between the output from the delay circuit 703 and the output from an adder 702. An adaptive control processor 705 sequentially updates the channel impulse response estimation vector H(i) in such a manner that the replica of the received signal is equal to the actual received signal. An example of the adaptive control processor 705 is an LSM algorithm (as described, for example, in Proakis, "Digital Communications", McGraw-Hill, 1983) to perform the following mathematical expression (1):

$$H(i)k+1 = H(i)k+,\delta\epsilon(k)S(k) \quad (1)$$

where, S(k) is the input to the delay circuit 708(1) and the output signal vectors from the delay circuits 708(1) through 708(M+1) at time k or the vector comprising decision results obtained from the time (k−(M−1))T to the time kT, ε(k) is an error signal derived from the subtraction circuit 704 at time k, and H(i) is the channel impulse response estimation vector. In accordance with the above algorithm, H(i)k is updated to output from the output terminals 707(1) through 707(M). Other algorithms may be applied as well.

Each of the branch metric calculation circuits 205(1) through 205(N), the branch metric composite circuit 206 and the Viterbi processor may be similar configuration to 104 (1) through 104(N), 105 and 106 in FIG. 2, respectively.

Figure 4:
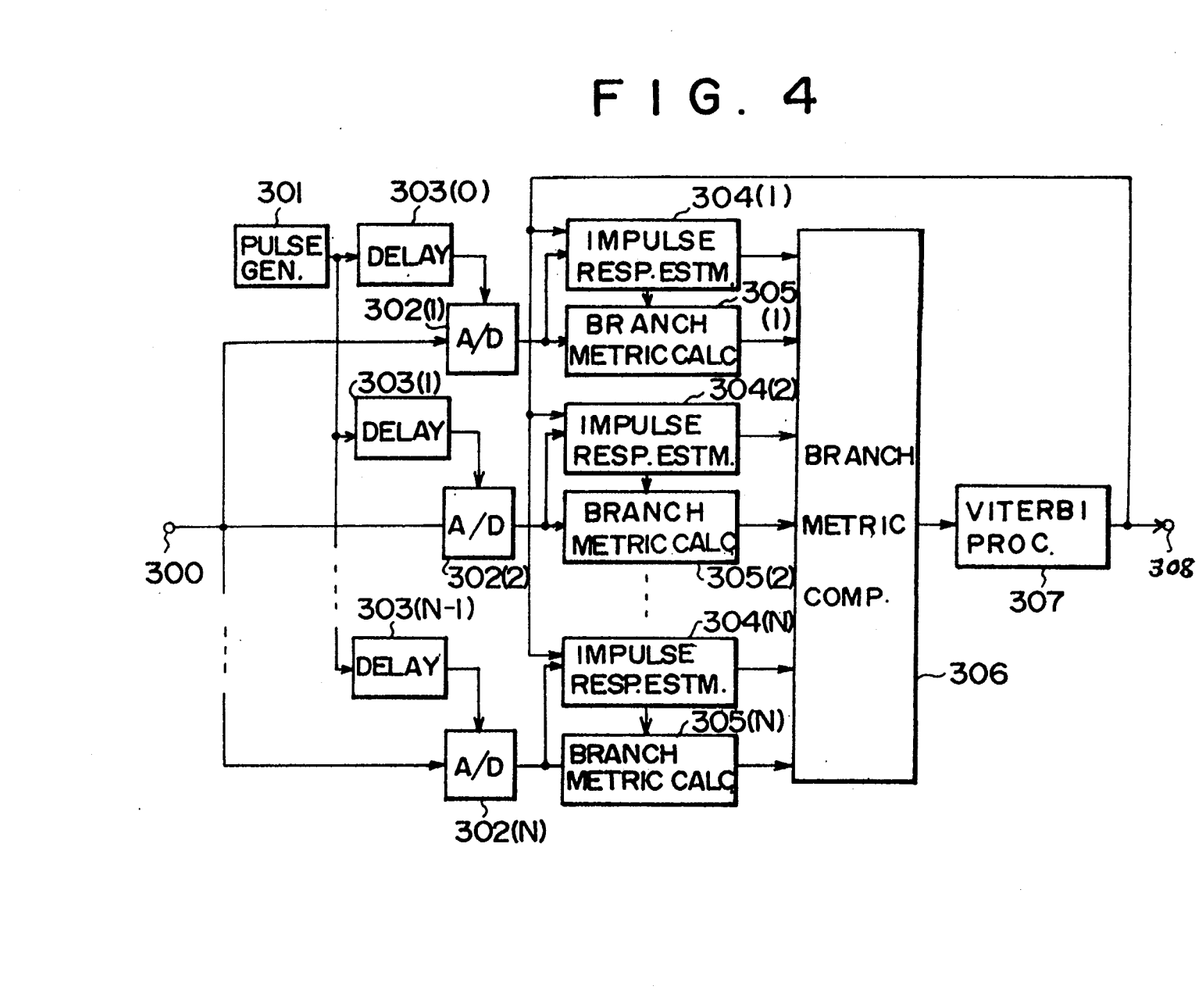
FIG. 4 is a block diagram of one embodiment of the fourth invention of the maximum likelihood sequence estimation apparatus.

Now, illustrated in FIG. 4 is a block diagram of an embodiment of the maximum likelihood sequence estimation apparatus in accordance with a fourth invention. In FIG. 4, represented by a reference numeral 300 is an input terminal, 301 is a pulse generator to generate the sampling pulse of the frequency (1/T) equal to the symbol rate, 302 (1) through 302(N) are A-D converters, 303(0) through 303 (N−1) are delay circuits to provide delay times it/N (i =1, 2, ..., N−1), 304(1) through 304(N) are channel impulse response estimation circuits, 305(1) through 305(N) are branch metric calculation circuits, 306 is a branch metric composite circuit, 307 is a Viterbi processor, and 308 is an output terminal. The pulse generator circuit 301, the A-D converters 302(1) through 302(N), the delay circuits 303(0) through 303(N−1), the branch metric calculation circuits 305(1) through 305(N), and the Viterbi processor 307 may be configured similarly to the pulse generator circuit 201, the A-D converters 202(1) through 202(N), the delay circuits 203(0) through 203(N−1), the branch metric calculation circuits 205(1) through 205(N), and the Viterbi processor 207 in FIG. 3, respectively. Each of the channel impulse response estimation circuits 304(1) through 304(N) may be configured as illustrated in FIG. 8.

Figure 8:
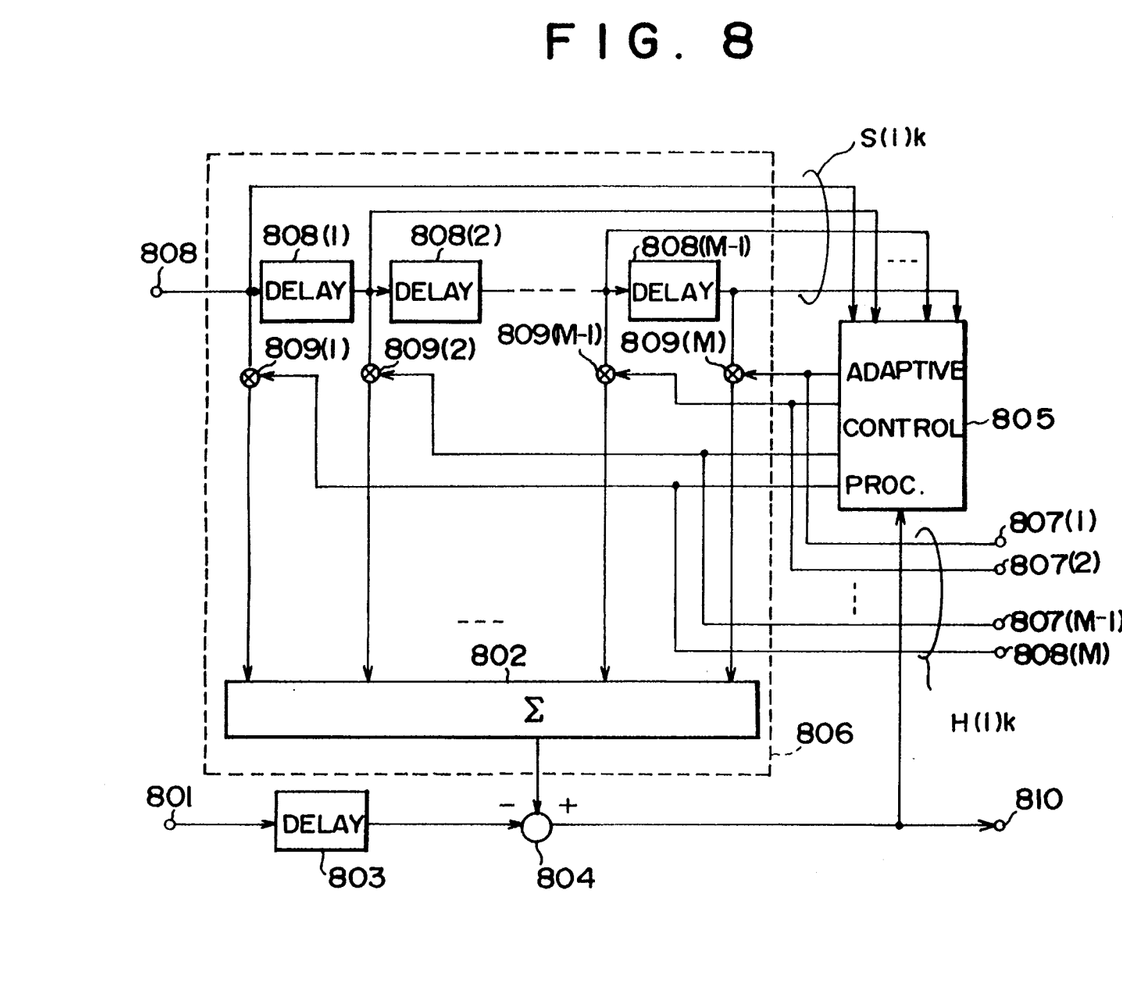
FIG. 8 is a block diagram of one example of a channel impulse response estimation circuit.

In FIG. 8, represented by reference numerals 800 and 801 are input terminals, 802 is an adder, 803 is a delay circuit, 804 is a subtraction circuit, 805 is an adaptive control processor, 806 is an M-tapped transversal filter, 807(1) through 807(54) and 810 are output terminals, 808(1) through 808(M−1) are delay circuits, and 809(1) through 809(54) are multiplier circuits. The difference between the channel impulse response estimation circuits in FIGS. 7 and 8 is that the output from the subtraction circuit 704 in FIG. 7 is applied only to the adaptive control processor 705 while the output from the subtraction circuit 804 in FIG. 8 is applied not only to the adaptive control processor 805 but also to the output terminal 810 as estimation process information. Also, the branch metric composite circuit 306 receives as inputs the branch metrics corresponding to the receive d signals of different phases derived from the branch metric calculation circuits 305(1) through 305(N) as well as the estimation process information derived from the channel impulse response estimation circuits 304(1) through 304(N) for outputting the composite branch metric.

Figure 9:
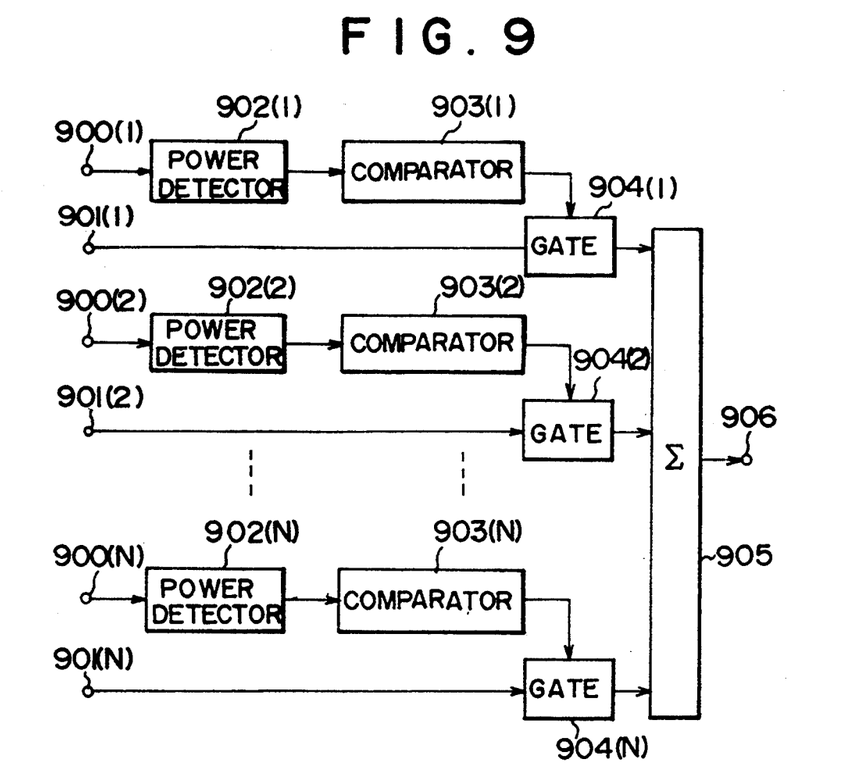
FIG. 9 is a block diagram of one example of the branch metric composite circuit.

The branch metric composite circuit 306 may be configured, for example, as illustrated in FIG. 9. In FIG. 9, represented by reference numerals 900(1) through 900(N) and 901(1) through 901(N) are input terminals, 902(1) through 902(N) are power detection circuits, 903(1) through 903(N) are comparator circuits, 904(1) through 904(N) are gate circuits, 905 is an adder, and 906 is an output terminal. In FIG. 9, applied to the input terminals 900(1) through 900(N) are the signals on the output terminals (810) from the channel impulse response estimation circuits 304(1) through 304(N) constituting the channel impulse response estimation circuit in FIG. 8. Also, applied to the input terminals 901(1) through 901(N) are the branch metrics derived from the branch metric calculation circuits 305(1) through 305(N) corresponding to the channel impulse response estimation circuits 304(1) through 304(N).

The power detection circuits 902(1) through 902(N) detect the signal power from the respective input terminals 900(1) through 900(N) for application to the comparator circuits 903(1) through 903(N). Each of the comparator circuits 903(1) through 903(N) compares the input level with a predetermined threshold level to output either "1" or "0" if the input level is larger or smaller than the threshold level, respectively. Such comparison output is applied to the gate circuits 904(1) through 904(N). Each of the gate circuits 904(1) through 904(N) disturbs the signal from the input terminals 901(1) through 901(N) when the input from the respective comparator circuits 903(1) through 903(N) is "1", but allows the signal from the input terminals 901(1) through 901(N) to pass when the input from the comparator circuits 903(1) through 903(N) is "0". The adder 905 adds only the branch metrics selected by the gate circuits 904(1) through 904(N) to output the composite branch metric from the output terminal 906. Hysteresis may be provided to the gate circuits 904(1) through 904(N) so that the signal is kept disturbed until the gate circuits are reset if "1" is entered once. It is also possible to apply to the input terminals 900(1) through 900(N) of the branch metric composite circuit 306 the current channel impulse response estimation vectors H(i)K (i=1, 2, . . . , N) for weighting the inputs from the input terminals 901(1) through 901(N) in accordance with H(i)K (i=1, 2, . . . , N), thereby obtaining the similar effect to the maximum ratio composite diversity as described, for example, in S. Stain, J. J. Jones, translated by Hideo Seki, "Modern Communication Circuit Theory", Morikita Publishing Co., 1970.

In case of applying the present invention to the burst mode transmission such as TDMA and the like, it is also possible to process the received signal after storing one burst length of outputs from the samplers 13(1) through 13(N) in FIG. 1. The constructions as illustrated in FIGS. 2 through 4 are easily applicable to such system.

As apparent from the above description, the present invention eliminates distortions due to sampling timing error from the optimum sampling timing and inter symbol interferences in a case of transmitting data by way of channels causing inter symbol interferences.

What is claimed is:

1. A maximum likelihood sequence estimation apparatus to decode a digital data signal, comprising:
   (a) a pulse generator for generating a sampling pulse having a constant time interval T;
   (b) N (N being an integer larger than 1) delay circuits to delay the sampling pulse by kT/N (k=0, 1, 2, . . . , N−1);
   (c) N A-D converters for sampling and digitizing a received signal whenever the sampling pulse from said N delay circuits is applied;
   (d) N channel impulse response estimation circuits to receive output from each of said N A-D converters and a decision result for estimating and outputting: a channel impulse response for said received signal and a respective estimation path information;
   (e) N branch metric calculation circuits to receive output from each of said N channel impulse response estimation circuits and output from each of said N A-D converters for calculating and outputting a branch metric for each input;
   (f) a branch metric composite circuit to receive output and the respective estimation path information from each of said N branch metric calculation circuits for composing the branch metrics and outputting a composed branch metric; and
   (g) a Viterbi processor to receive the composed branch metric for outputting the decision result.

2. A maximum likelihood sequence estimation apparatus of claim 1, wherein each of said N channel impulse response estimation circuits comprises:
   (a) an M-tapped transversal filter to receive the decision result as an input for outputting a filtering result and a time sequence of decision results by filtering the time sequence of decision results inputted at time interval K−M through K with a channel impulse response estimation vector H(k) at time k as a tap factor;
   (b) delay circuits to receive, as an input signal, output from respective A-D converters for delaying the input signal by a time equal to a decoder delay caused in said Viterbi processor;
   (c) a subtraction circuit to detect and output an error signal between an output from said delay circuits and the filtering result;
   (d) an adaptive control processor to receive the time sequence of the decision result and the error signal for updating the channel impulse response estimation vector to output to both of said transversal filter and an output terminal; and
   (e) a terminal to output the error signal as estimation process information, and wherein said branch metric composite circuit comprises:
      (a) N power detection circuits to receive, respectively, the estimation process information outputted from the N channel impulse response estimation circuits for detecting and outputting respective powers of the estimation process information;
      (b) N comparator circuits to receive respective outputs from said N power detection circuits for comparing with a predetermined threshold level to output gate control signals showing the respective outputs from said N power detection circuits are either larger or smaller than the predetermined threshold level;
      (c) an N gate circuits group to receive the gate control signals from the respective N comparator circuits and respective outputs from said N branch metric composite circuit for comparing the gate control signals with the predetermined threshold level to output either Q level signal without outputting the respective outputs of the N branch metric composite circuit if the gate control signal is larger than the predetermined threshold level, or the respective outputs of the N branch metric composite circuit if the gate control signal is smaller than the predetermined threshold level;
      (d) an adder to receive and add output of the N gate circuits group for outputting as the branch metric.

3. A maximum likelihood sequence estimation apparatus to decode a digital data signal, comprising:
   (a) sampling and outputting means for sampling a received signal in N (N being an integer larger than 1) different sampling phases using a sampling pulse having N different phases each having a constant time interval T;
   (b) calculation means for receiving the received signal sampled in the N different sampling phases to calculate a branch metric, said calculation means comprising: means to estimate a channel impulse response from input signals derived from sampling in said different sampling phases for outputting an estimation value of the channel impulse response;

means to output a partial branch metric by obtaining the branch metric for each input signal in accordance with an output signal sampled in said N different sampling phases and the estimated value of the channel impulse response for each output signal sampled in said N different sampling phases; and means to output a sum of said partial branch metrics as the branch metric; and (c) means to receive the branch metric for estimation of the maximum likelihood sequence estimation.

4. A maximum likelihood sequence estimation apparatus to decode a digital data signal, comprising:

(a) sampling and outputting means for sampling a received signal in N (N being an integer larger than 1) different sampling phases using a sampling pulse having N different phases each having a constant time interval T, said sampling and outputting means comprising: means to generate a sampling pulse having a frequency 1/NT; means to divide said sampling pulse by 1/N and output N sampling pulse trains of N different phases; and means to perform sampling the received signal by said N sampling pulse trains;

(b) calculation means for receiving the received signal sampled in the N different sampling phases to calculate a branch metric; and (c) means to receive the branch metric for estimation of the maximum likelihood sequence estimation.

* * * * *

UNITED STATES PATENT AND TRADEMARK OFFICE
CERTIFICATE OF CORRECTION

PATENT NO.    : 5,444,721
DATED         : August 22, 1995
INVENTOR(S)   : Kazuhiro OKANOUE, et al It is certified that errors appears in the above-identified patent and that said Letters Patent is hereby corrected as shown below:

Col. 3, line 54, delete "Viterbl" insert -- Viterbi --

Col. 4, line 9, delete "o" insert -- . --

Col. 6, line 28, delete "54" insert -- M --

Col. 6, line 30, delete "54" insert -- M --

Signed and Sealed this

Fourteenth Day of November, 1995

BRUCE LEHMAN

*Attest:*

*Attesting Officer*    Commissioner of Patents and Trademarks